United States Patent
Schultz

(10) Patent No.: US 11,515,230 B2
(45) Date of Patent: *Nov. 29, 2022

(54) VARIABLE PIN FIN CONSTRUCTION TO FACILITATE COMPLIANT COLD PLATES

(71) Applicant: International Business Machines Corporation, Armonk, NY (US)

(72) Inventor: Mark Delorman Schultz, Ossining, NY (US)

(73) Assignee: INTERNATIONAL BUSINESS MACHINES CORPORATION, Armonk, NY (US)

(*) Notice: Subject to any disclaimer, the term of this patent is extended or adjusted under 35 U.S.C. 154(b) by 84 days.

This patent is subject to a terminal disclaimer.

(21) Appl. No.: 16/676,515

(22) Filed: Nov. 7, 2019

(65) Prior Publication Data

US 2020/0091032 A1 Mar. 19, 2020

Related U.S. Application Data

(63) Continuation of application No. 15/264,292, filed on Sep. 13, 2016, now Pat. No. 10,504,814.

(51) Int. Cl.
| | |
|---|---|
| *H01L 23/367* | (2006.01) |
| *F28D 9/00* | (2006.01) |
| *H01L 21/48* | (2006.01) |
| *H01L 23/467* | (2006.01) |
| *H01L 23/473* | (2006.01) |

(52) U.S. Cl.
CPC ...... *H01L 23/3677* (2013.01); *H01L 21/4882* (2013.01); *H01L 21/4885* (2013.01); *F28D 9/0031* (2013.01); *H01L 23/467* (2013.01); *H01L 23/473* (2013.01); *Y10T 428/12507* (2015.01)

(58) Field of Classification Search
CPC ... F28D 9/0031; F28D 9/0093; H01L 23/3677
See application file for complete search history.

(56) References Cited

U.S. PATENT DOCUMENTS

| | | | |
|---|---|---|---|
| 4,884,630 | A | 12/1989 | Nelson et al. |
| 6,634,421 | B2 | 10/2003 | Ognibene et al. |
| 6,898,082 | B2 | 5/2005 | Dessiatoun et al. |
| 6,968,892 | B1 | 11/2005 | Symonds |
| 7,264,041 | B2 | 9/2007 | Karidis et al. |
| 7,355,855 | B2 | 4/2008 | Karidis et al. |
| 7,545,647 | B2 | 6/2009 | Karidis et al. |

(Continued)

OTHER PUBLICATIONS

Office Action for U.S. Appl. No. 15/264,292 dated Jan. 4, 2019, 18 pages.

(Continued)

*Primary Examiner* — Adam Krupicka
(74) *Attorney, Agent, or Firm* — Amin, Turocy & Watson, LLP

(57) ABSTRACT

A device can comprise a plurality of layers stacked and bonded on one another, wherein at least one layer of the plurality of layers comprises: a first active region comprising first pin portions positioned in a first planar arrangement; and a second active region comprising second pin portions positioned in a second planar arrangement, wherein the second planar arrangement is different from the first planar arrangement. The device can also comprise a conformable layer adjacent to at least one of the plurality of layers.

20 Claims, 12 Drawing Sheets

(56) References Cited

U.S. PATENT DOCUMENTS

| | | |
|---|---|---|
| 7,545,648 B2 | 6/2009 | Karidis et al. |
| 8,030,755 B2 | 10/2011 | Lee et al. |
| 8,363,402 B2 | 1/2013 | Brunschwiler et al. |
| 8,659,898 B2 | 2/2014 | Brunschwiler et al. |
| 9,010,405 B1 | 4/2015 | Bharalhan et al. |
| 2003/0227732 A1 | 12/2003 | Dessiatoun et al. |
| 2005/0161806 A1 | 7/2005 | Divakar et al. |
| 2008/0047696 A1 | 2/2008 | Sperandei et al. |
| 2008/0066888 A1 | 3/2008 | Tong et al. |
| 2010/0170667 A1 | 7/2010 | Bertolotti et al. |
| 2011/0156244 A1 | 6/2011 | Lou |
| 2012/0097370 A1 | 4/2012 | Correa |
| 2012/0168112 A1 | 7/2012 | Scott |
| 2013/0112388 A1 | 5/2013 | Kwak et al. |
| 2013/0199767 A1 | 8/2013 | Karidis et al. |
| 2015/0173251 A1 | 6/2015 | Campbell et al. |
| 2015/0359139 A1 | 12/2015 | Campbell et al. |

OTHER PUBLICATIONS

List of IBM Patents or Applications Treated as Related.
Notice of Allowance received for U.S. Appl. No. 15/264,292 dated Jul. 23, 2019, 16 pages.

VARIABLE PIN FIN CONSTRUCTION TO FACILITATE COMPLIANT COLD PLATES

STATEMENT REGARDING FEDERALLY SPONSORED RESEARCH OR DEVELOPMENT

This invention was made with Government support under B604142 awarded by the Department of Energy. The Government has certain rights to this invention.

BACKGROUND

The subject disclosure relates to integrated circuit packaging, and more particularly to pin fin heat sinks for integrated circuit packaging.

SUMMARY

The following presents a summary to provide a basic understanding of one or more embodiments of the invention. This summary is not intended to identify key or critical elements, or delineate any scope of the particular embodiments or any scope of the claims. Its sole purpose is to present concepts in a simplified form as a prelude to the more detailed description that is presented later. In one or more embodiments described herein, apparatus and/or methods that facilitate production of cold plates comprising varying density heat sink sheets are described.

According to an embodiment, a device is provided. The device can comprise a plurality of layers stacked and bonded on one another, wherein at least one layer of the plurality of layers can comprise several active regions. A first active region can comprise first pin portions positioned in a first planar arrangement; and a second active region can comprise second pin portions positioned in a second planar arrangement, different from the first planar arrangement. The device also comprises a conformable layer adjacent to at least one of the plurality of layers.

According to another embodiment, another device is provided. The device can comprise a plurality of layers adapted to couple to a load or a heat source, wherein the plurality of layers are bonded in a stacked configuration and can comprise active regions with varied densities. A first active region can comprise first pin portions positioned in a first planar arrangement; and a second active region can comprise second pin portions positioned in a second planar arrangement, wherein the second planar arrangement is different from the first planar arrangement, and wherein the apparatus is disposed to support the load. The device can also comprise a conformable layer adjacent to at least one of the plurality of layers.

According to yet another embodiment, a method is provided. The method can comprise providing a plurality of layers comprising a plurality of respective pin portions, wherein the providing the plurality of layers can several steps. A first plurality of pin portions of a first layer can be configured according to a first configuration, and a second plurality of pin portions of a second layer can be configured according to a second configuration. Furthermore, the first plurality of pin portions can be aligned adjacent to the second plurality of pin portions, and the plurality of layers can be stacked, according to the aligning, resulting in adjacent layers. The pin portions of the adjacent layers and a conformable layer can be bonded to form a stack of bonded layers, wherein the first plurality of pin portions and the second plurality of pin portions form columns of pin fins.

These and other features and advantages will become apparent from the following detailed description of illustrative embodiments thereof, which is to be read in connection with the accompanying drawings.

DETAILED DESCRIPTION

The following detailed description is merely illustrative and is not intended to limit embodiments and/or application or uses of embodiments. Furthermore, there is no intention to be bound by any expressed or implied information presented in the preceding Background or Summary sections, or in the Detailed Description section.

One or more embodiments are now described with reference to the drawings, wherein like referenced numerals are used to refer to like elements throughout. In the following description, for purposes of explanation, numerous specific details are set forth in order to provide a more thorough understanding of the one or more embodiments. It is evident, however, in various cases, that the one or more embodiments can be practiced without these specific details.

It is to be understood that the present disclosure can be described in terms of a given illustrative architecture comprising a heat sink arrangement; however, other architectures, structures, materials and process features and steps can be varied within the scope of the present invention.

It should also be understood that when an element such as an interface layer, load, etc. is referred to as being "on" or "over" another element, it can be directly on the other element or intervening elements can also be present. In contrast, when an element is referred to as being "directly on" or "directly over" another element, there are no intervening elements present. It should also be understood that when an element is referred to as being "connected" or "coupled" to another element, it can be directly connected or coupled to the other element or intervening elements can be present. In contrast, when an element is referred to as being "directly connected" or "directly coupled" to another element, there are no intervening elements present.

Figure 1:
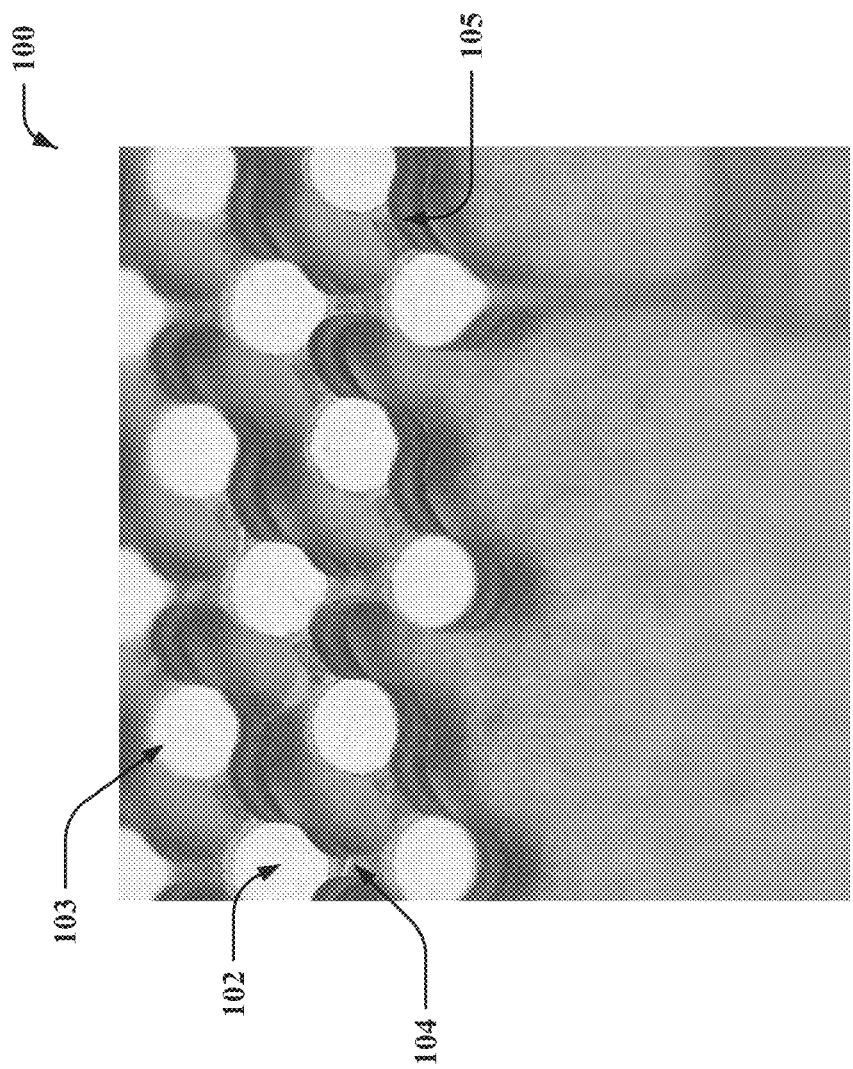
FIG. 1 illustrates a non-limiting perspective view of a heat sink sheet showing a link pattern in accordance with one or more embodiments described herein.

FIG. 1 illustrates a non-limiting perspective view of a heat sink sheet showing a link pattern in accordance with one or more embodiments described herein. In FIG. 1, a single flexible heat sink sheet 100 is shown. A heat sink comprising a heat sink sheet 100 can transfer thermal energy from a higher temperature device to a lower temperature fluid medium. In various embodiments, the fluid medium can include, but is not limited to, air, water, refrigerants, oil, etc. In embodiments in which the fluid medium is water, the heat sink is frequently called a cold plate.

In some embodiments, heat sink 100 can comprise a plurality of pin portions 102, 103 spaced apart from each other in a planar arrangement. The pin portions 102, 103 can be thermally conductive and, in some embodiments, links (e.g., links 104, 105) can connect at least one set of adjacent pin portions 102, 103 of the plurality of pin portions 102, 103 to form a planar sheet such that a configuration of a width of the pin portions 102, 103 to a width of the links 104, 105 is disposed to make the heat sink sheet 100 flexible. Additionally, heat sink sheet 100 can comprise active regions composed of pin fin configurations with varied sparsities or densities. For purposes of this disclosure it should be noted that the terms "region" and "area" can be used interchangeably. Consequently, "active area" can refer to any x-y area where heat transfer is expected to occur. For instance, a central manifold area, which can exhibit inferior thermal performance relative to other areas, can also be an active region as opposed to non-active regions 420.

The flexible heat sink sheet 100 can comprise links 104, 105 joining pin portions 102, 103 as shown. It should be understood that although the pin portions 102, 103 are depicted as circular, they can be minted or stamped as ovals, triangles, segments, curved segments, polygons, (e.g., hexagons, octagons, rectangles) or any other shape or combinations of shapes. The shapes can be selected based on desired air or liquid flow across the pins or columns once assembled. The dimensions and density of the pins can also be scaled in accordance with the amount of heat being sunk. This can involve a balance between convective heat transfer due to fluid passing over the pins and a conduction through the pins.

Figure 2:
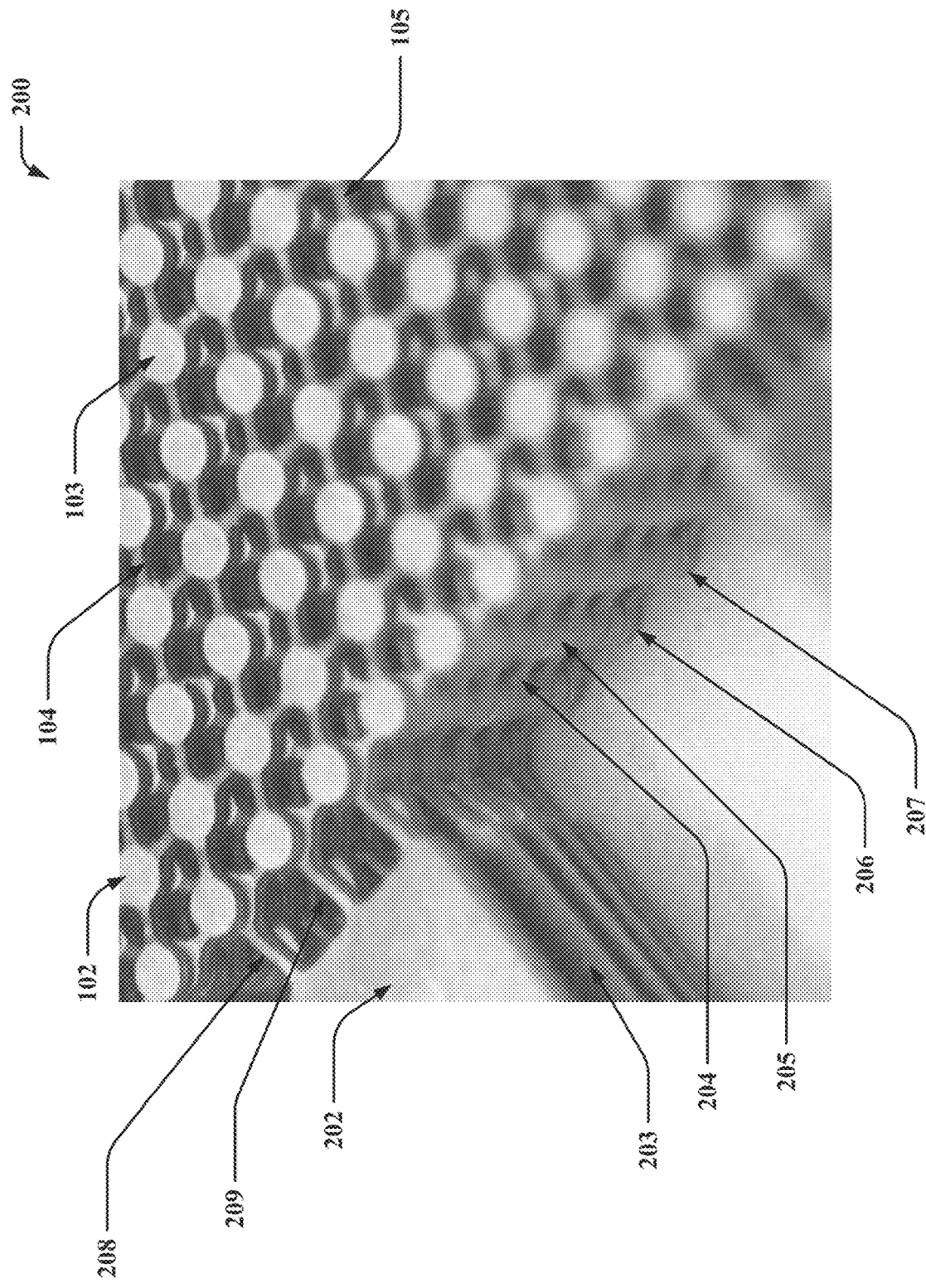
FIG. 2 illustrates a non-limiting perspective view of a stack of heat sink sheets showing handlers in accordance with one or more embodiments described herein.

FIG. 2 illustrates a non-limiting perspective view of a stack of heat sink sheets showing handlers in accordance with one or more embodiments described herein. Repetitive description of like elements employed in other embodiments described herein is omitted for sake of brevity.

As shown in FIG. 1, a heat sink, in accordance with the present disclosure, can comprise a plurality of layers being disposed substantially parallel with one another. The heat sink can include a surface that is substantially parallel with a surface of a heat source or mechanical load.

In some embodiments, each of (or, one or more of) the layers can comprise a plurality of pin portions 102, 103 spaced apart from each other in a planar arrangement. With reference to FIGS. 1 and 2, in some embodiments, the pin portions 102, 103 of the layers 202, 203 can be stacked and bonded to form pin fins extending in a transverse direction relative to the location of a heat source in order to sink heat.

In some embodiments, at least one compliant layer can be disposed between the pin fins and the location of the potential heat source. The compliant layer can provide compliance such that the pin portions 102, 103 can accommodate dimensional differences between the heat sink 100 and any mechanical load as well as between the heat sink sheet 100 and the heat source being cooled.

As such, pin fin compliant heat sinks can be formed using one or more sheets of pin forming structures. Multiple stacked sheets 204, 205 comprising pin forming structures can be stacked to occupy a gap space between a heat source and a support structure or mechanical load. The stacked sheets 204, 205 can comprise compliant elements (such as those described below with reference to FIG. 8) or can be disposed on a compliant element to provide compliance and accommodate different heights or gap distances to be bridged. The present embodiments provide a fabrication process as well as a customizable and compliant fit for supporting heat sources (e.g., chips or other electronic components). The stacked sheets can be employed with any heat source that benefits from having a heat sink (e.g. Single Chip Modules (SCMs) or Multi-Chip Modules (MCMs)).

In alternating layers of sheets, the links 104, 105 can be located in different positions, as shown in FIG. 2, to allow fluid flow between the pins and to prevent or reduce the likelihood of bonding of the links 104, 105 from one layer to another. It should also be noted that the width of links 104, 105 from one side of a link to another side of the link can be less than the width of the pins 102, 103 from one side of a pin to another side of the pin. These dimensions can be achieved during a stamping or etching process, although other formation processes can be employed. The pins 102, 103 can also be subjected to a cleaning process (e.g., etching, pickling, chemical milling, etc.) to remove oxides or other contaminants and/or to prepare the pins 102, 103 for bonding.

The stacked sheets 204, 205 can be formed by bonding the pins 102, 103 to form columns 206, 207 as depicted as apparatus 200. Handlers 202, 203 are shown aligning the stacked sheets 204, 205 for bonding the pins 102, 103 to form the columns 206, 207. The top and bottom sheets of the stacked sheets 204, 205 can be flexible enough to allow pins to move up and down relative to their neighboring pins 102, 103 on various layers of the stacked sheets 204, 205 once assembled. Thus, physical differences of loads (e.g. curved or out-of-flat heat source surfaces) can be accommodated by the flexible sheets.

The stacked sheets, 204, 205 shows links 104, 105 alternating between the stacked sheets, 204, 205 preventing (or, in some embodiments, reducing the likelihood of) link-to-link bonding in the vertical direction and permitting fluid flow between the stacked sheets, 204, 205. Links 104, 105 can be removed or weakened with an etch process or could be separated mechanically with an edged die to further increase fluid flow or the links 104, 105 can be left in place to increase conductive paths. In some embodiments, links 104, 105 to handlers 202, 203 can be removed entirely. Additionally, the layers of the stacked sheets 204, 205 containing columns 206, 207 can comprise locating connections 208, 209 or links between columnar sections. These locating connections 208, 209, or a portion thereof, can be deleted or broken after assembly to permit each resulting pin 102, 103 (or, in some embodiments, one or more resulting pins) to move or flex independently upon completion. The resulting pins 102, 103 can be attached to a conformable sheet or compliant layer. By removing some links 104, 105, the resulting cold plate can gain additional flexibility. Consequently, the stacked sheets, 204, 205 can be customized to fit any number of different size and shape heat source configuration or load or support structure configuration.

It should be understood that the present embodiments have described a horizontally disposed configuration where the heat source is able to be placed under the heat sink active areas generated by stacking the sheets 204, 205; however, the configuration of the heat sink can take on many forms. For example, pin portions 102, 103 can be employed on multiple sides of the heat source, about its periphery, and/or in relation to particular areas of portions of the heat source. In addition, the heat source can be vertically or transversely disposed with pin portions 102, 103 at any location.

Figure 3:
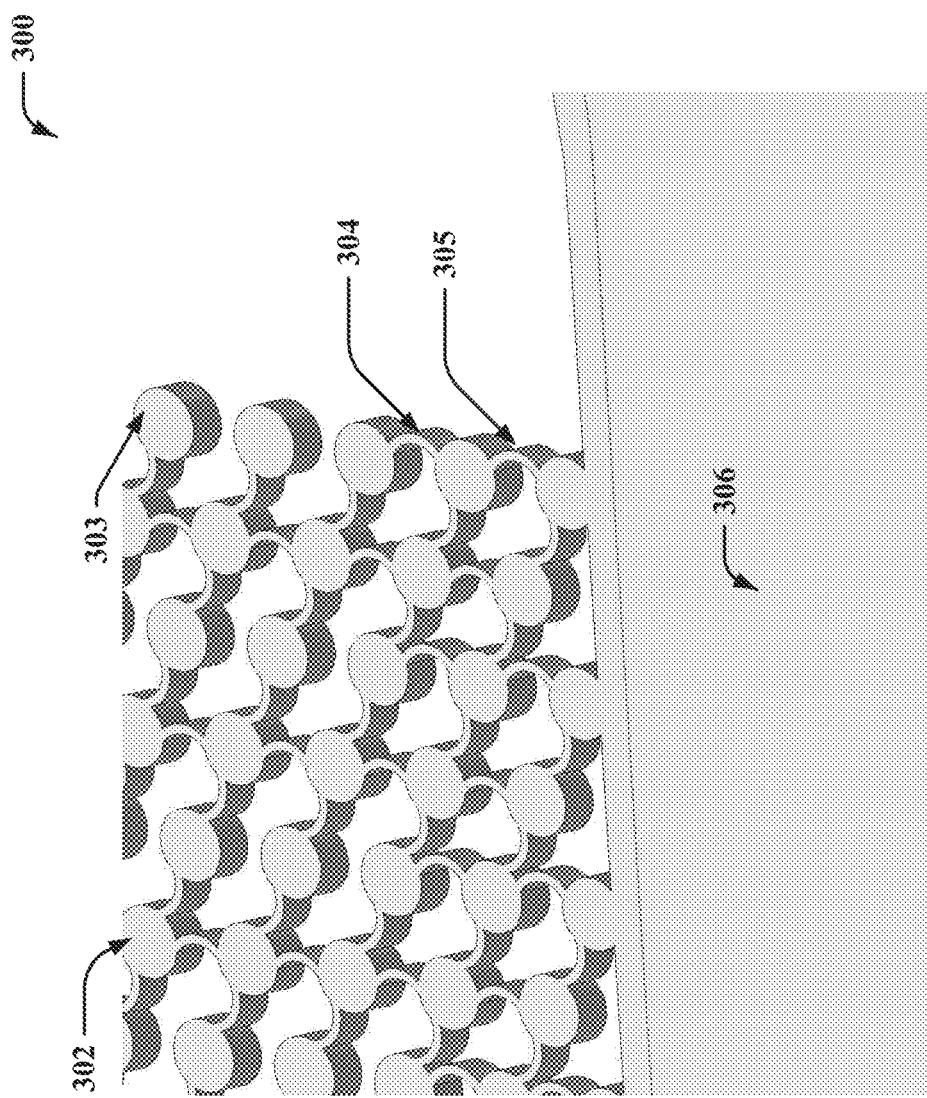
FIG. 3 illustrates another non-limiting perspective view of a heat sink sheet showing an alternative link pattern in accordance with one or more embodiments described herein.

FIG. 3 illustrates another non-limiting perspective view of a heat sink sheet showing an alternative link pattern in accordance with one or more embodiments described herein. This link pattern can provide more sheet and heat sink flexibility. Repetitive description of like elements employed in other embodiments described herein is omitted for sake of brevity.

While FIG. 1 shows substantially linear links 104, 105, FIG. 3 shows curved links 304, 305 resulting in a different pin-to-link configuration than FIG. 1. In another embodiment, the heat sink sheet 300 can comprise pins portions 302, 303 and curved links 304, 305 connected to a handle 306. Pairs of the curved links 304, 305 stacked on non-matching heat sink sheets 300 can impede fluid or air flow while maintaining flexibility of the heat sink sheet 300. Non-matching links can be links of other heat sink sheets (e.g. heat sink sheet 100) that are disposed in a different configuration than that of the curved links 304, 305 shown in FIG. 3.

Figure 4:
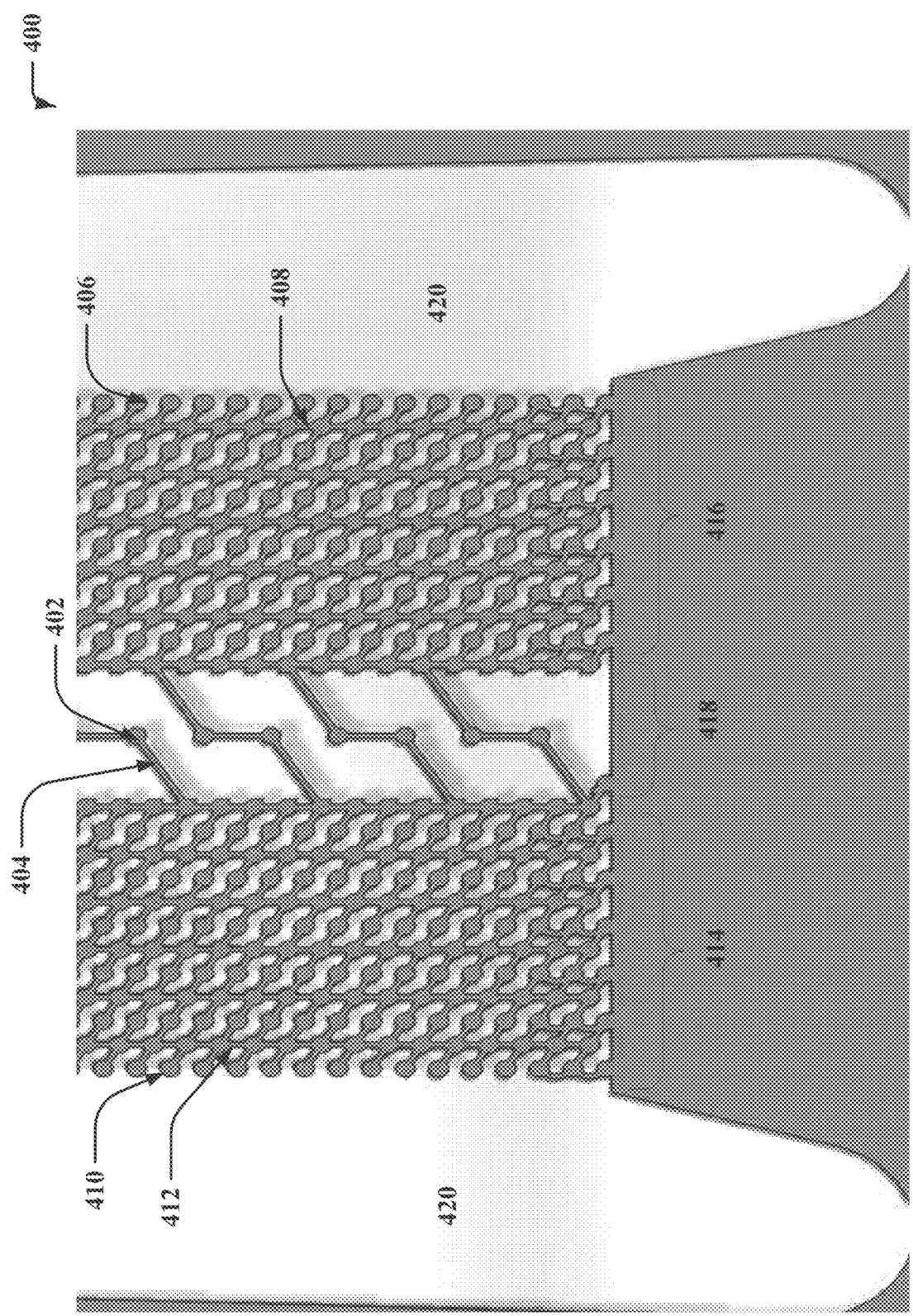
FIG. 4 illustrates a non-limiting top view of a heat sink sheet showing active regions with varied densities and configurations in accordance with one or more embodiments described herein.

FIG. 4 illustrates a non-limiting top view of a heat sink sheet showing active areas with varied densities and configurations in accordance with one or more embodiments described herein. Repetitive description of like elements employed in other embodiments described herein is omitted for sake of brevity.

Active areas can comprise high performance areas and low performance areas. As used herein, the terms "low performance areas" can indicate an area that allows for lower pressure drop flow within the area as opposed to a "high performance area". In this embodiment, the heat sink sheet 400 can comprise pin portions 402, 406, 410 and links 404, 408, 412. In different embodiments, the configuration between pin portions 402, 406, 410 and links 404, 408, 412 can vary. For instance, the length (from pin to pin) of link 404 can be greater than the length of link 408 and link 412. To reduce a pressure drop across a cold plate, varied densities of pin portions on the heat sink sheet 400 can be constructed to support a mechanical load and maintain thermal performance. For example, a low performance active area 418 of a heat sink sheet 400 can be placed between two high performance active areas 414, 416 to allow for significant coolant flow through the high performance active areas 414, 416 and the low performance active area 418. The low performance active area 418 can comprise a sparser pin-to-link configuration than the adjacent high performance active areas 414, 416 (e.g. there are more pins and links in the adjacent high performance active areas than there are in the low performance active area).

Figure 5:
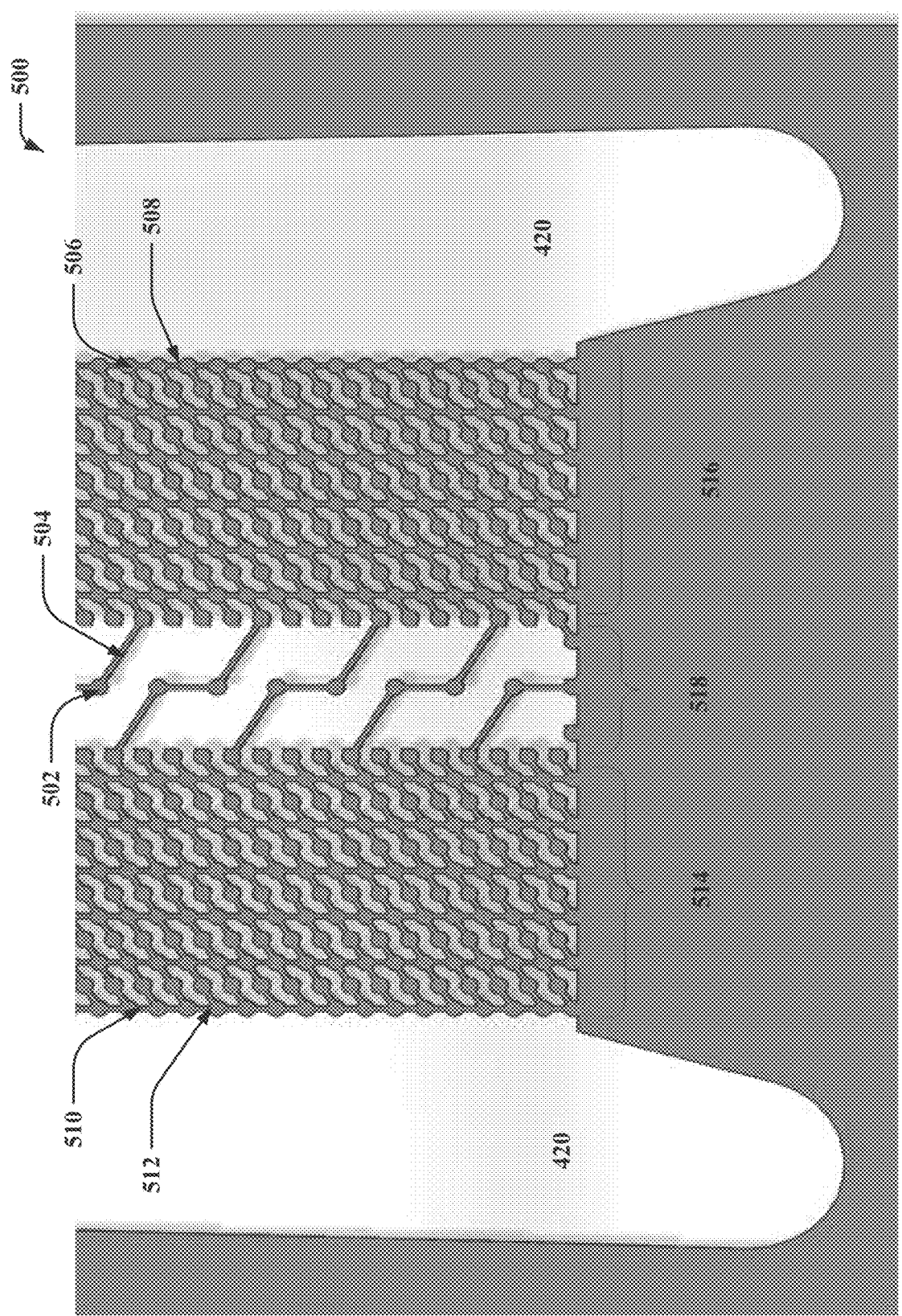
FIG. 5 illustrates a non-limiting top view of a heat sink sheet showing active regions with varied densities and configurations in accordance with one or more embodiments described herein.

Additionally, the pin-to-link configuration can vary within the low performance active area 418 from left to right as shown in FIG. 4 and FIG. 5. Notably, the pin-to-link configuration of the high performance active areas 414, 416 is greater than that of the pin-to-link configuration of the low performance active area 418. Therefore the density of the high performance active areas 414, 416 can be denser than the low performance active area 418, whereas the low performance active area 418 comprises a sparser array of pins and links. Although FIG. 4 depicts two high performance active areas 414, 416 and one low performance active area 418, in alternate embodiments, two or more high performance active areas can exist and/or multiple low performance active areas can exist. It should also be noted that the pins 402 and links 404 of the low performance active area 418 can be disposed in a planer arrangement different than that of the high performance active areas 414, 416, whereas the pin 402 link 404 configuration of the low performance active area 418 can traverse the sink sheet in an ascending configuration from left to right as opposed to the descending configuration from left to right of the pin 410 link 412 configuration of the high performance active areas 414, 416.

FIG. 5 illustrates a non-limiting top view of a heat sink sheet showing active areas with varied densities and configurations in accordance with one or more embodiments described herein. Repetitive description of like elements employed in other embodiments described herein is omitted for sake of brevity.

As shown, the heat sink sheet 500 can comprise pin portions 502, 506, 510 and links 504, 508, 512. However, the configuration between pin portions 502, 506, 510 and links 504, 508, 512 can vary. For instance, the length of link 504 can be greater than the length of link 508 and link 512. To reduce a pressure drop across a cold plate, varied densities of pin portions on a heat sink sheet can be constructed to support a mechanical load and maintain thermal performance with respect to the high performance active areas 514, 516.

For instance, a low performance active area 518 can be placed between two high performance active areas 514, 516 to allow for significant coolant flow. The low performance active area 518 can comprise a sparser pin-to-link configuration than the adjacent high performance active areas 514, 516. Additionally, the pin-to-link configuration can vary within the low performance active area 518 from left to right as show in FIG. 4 and FIG. 5 (e.g. ascending configuration, descending configuration, linear configuration, etc.). Notably, the pin-to-link configuration of high performance active area 514 and high performance active area 516 is greater than that of the pin-to-link configuration of the low performance active area 518. Therefore the density of the high performance active areas 514, 516 is denser than the low performance active area 518, whereas the low performance active area 518 comprises a sparser array of pins and links. Although FIG. 5 depicts two high performance active areas 514, 516, in alternate embodiments, two or more active areas can exist. It should also be noted that the pin portion 502 and link 504 of the low performance active area 518 can be disposed in a planer arrangement different than that of the high performance active areas 514, 516, whereas the pin portion 502 link 504 configuration of the low performance active area 518 can traverse the heat sink sheet 500 in a descending configuration from right to left as opposed to the ascending configuration of the low performance active area 418 as shown in FIG. 4.

Figure 6:
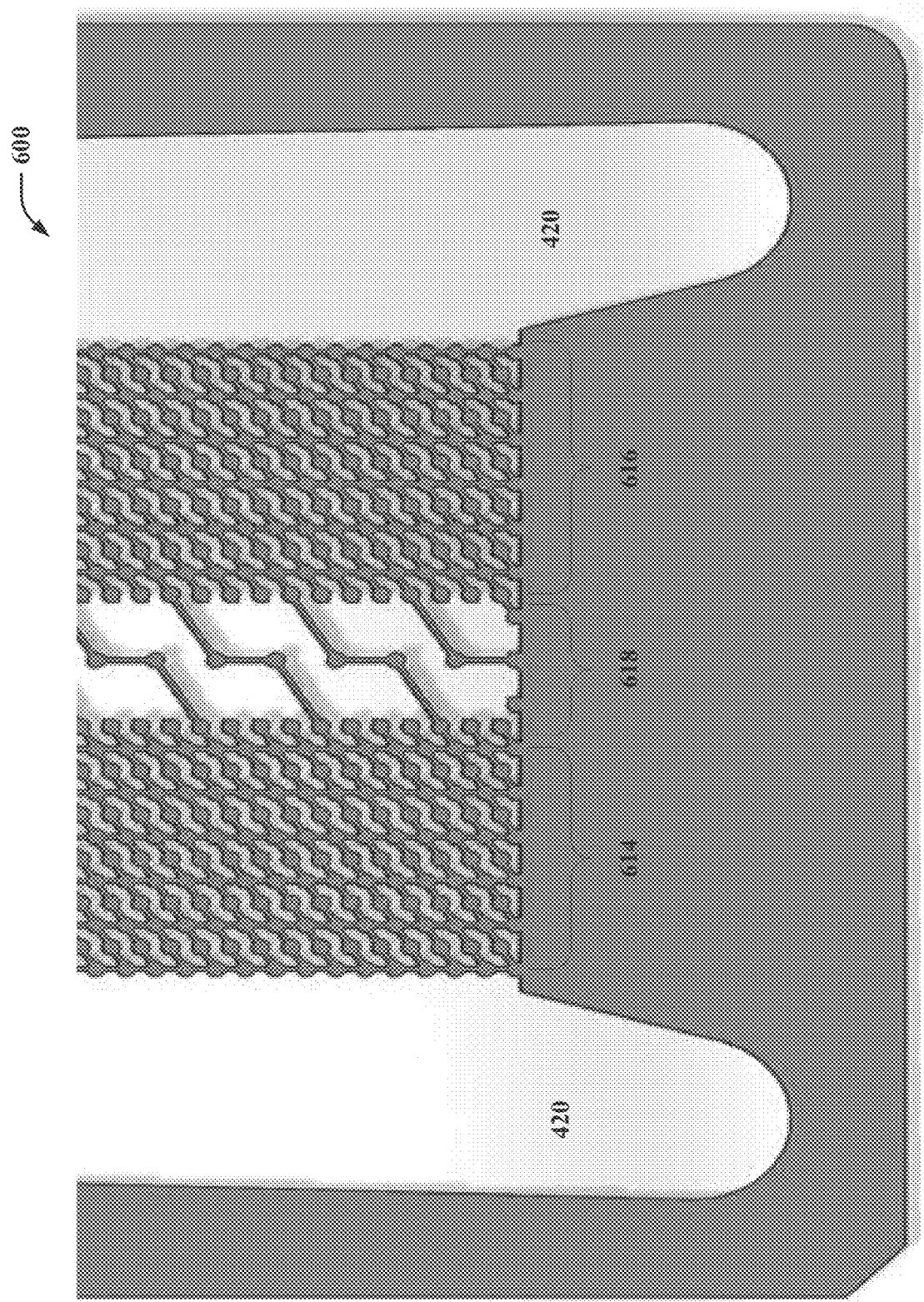
FIG. 6 illustrates a non-limiting top view of a heat sink sheet showing active regions with varied densities and configurations in accordance with one or more embodiments described herein.
Figure 7:
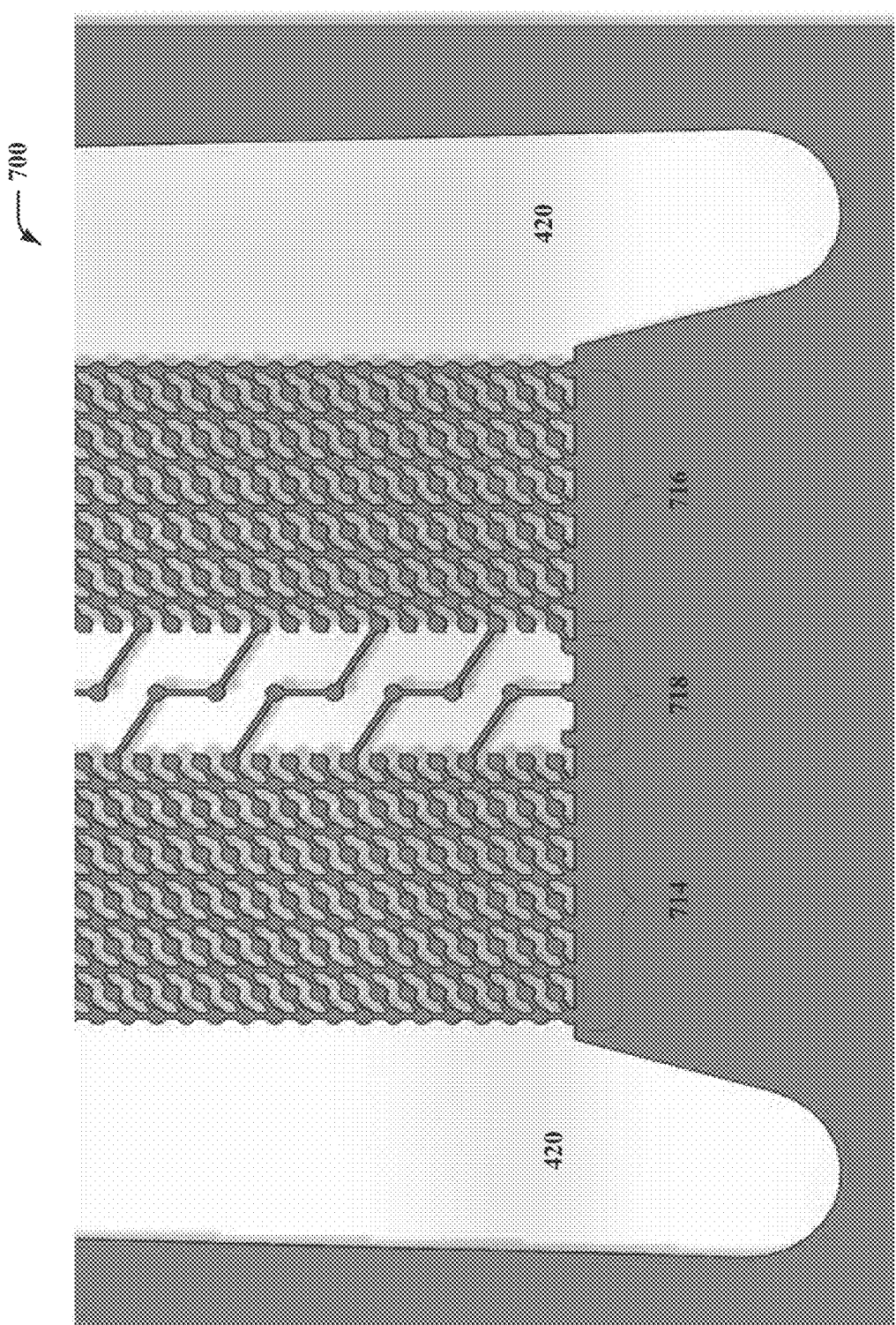
FIG. 7 illustrates a non-limiting top view of a heat sink sheet showing active regions with varied densities and configurations in accordance with one or more embodiments described herein.

FIGS. 6 and 7 illustrate a non-limiting top view of a heat sink sheet showing active areas with varied densities and configurations in accordance with one or more embodiments described herein. Repetitive description of like elements employed in other embodiments described herein is omitted for sake of brevity.

As shown, heat sink sheet 600 illustrates (from left to right) a high performance active area 614 comprising ascending pin-to-link configurations, a low performance active area 618 comprising ascending pin-to-link configurations, and another high performance active area 616 comprising ascending pin-to-link configurations. However, a heat sink sheet 700 illustrates (from left to right) a high performance active area 714 comprising ascending pin-to-link configurations, a low performance active area 718 comprising descending pin-to-link configurations, and another a high performance active area 716 comprising ascending pin-to-link configurations. It should be noted that any of the heat sink sheets 400, 500, 600, 700 can be stacked to form any possible configuration to form the cold plates shown in FIGS. 8 and 9.

Figure 8:
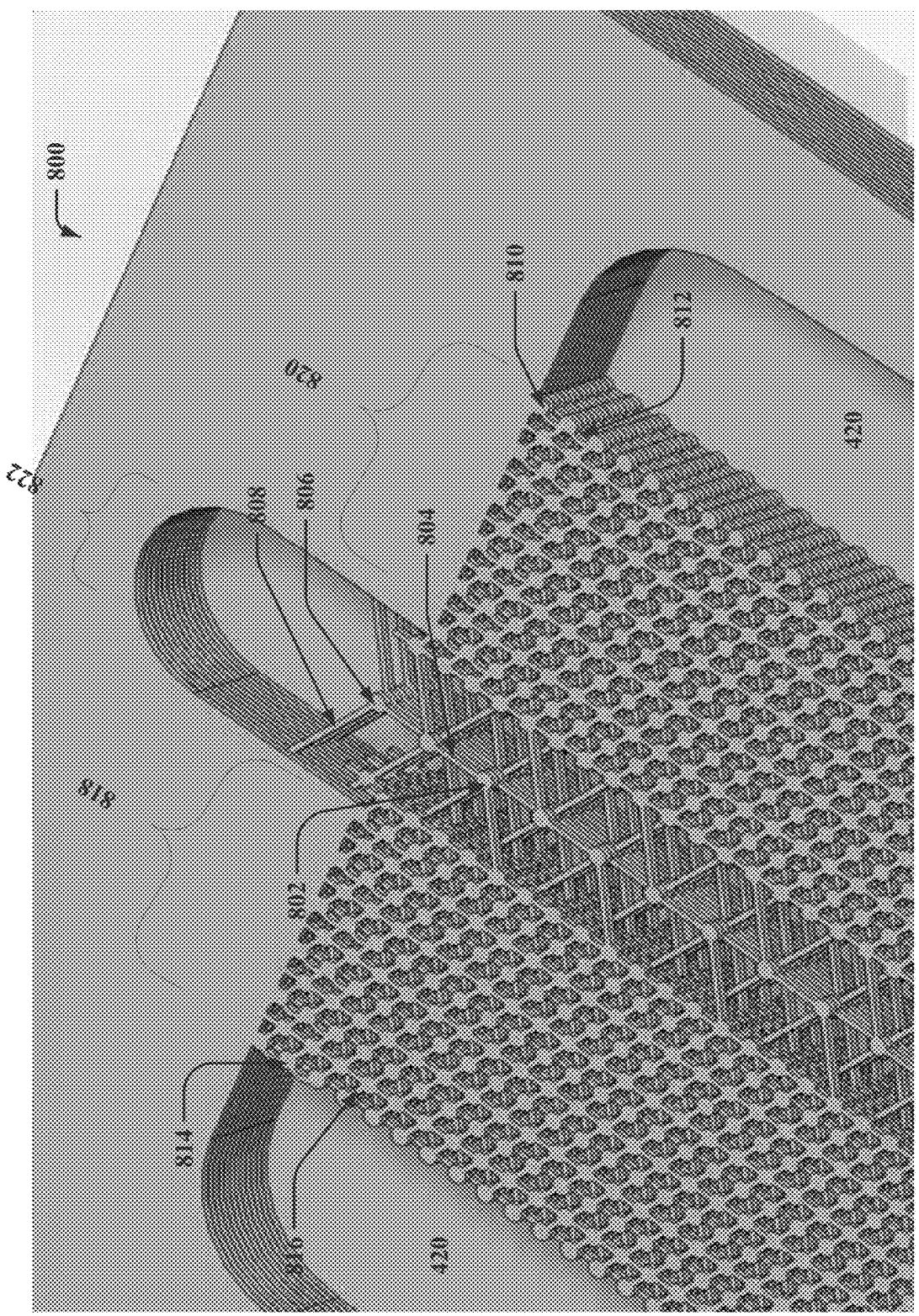
FIG. 8 illustrates a non-limiting perspective view of a stack of heat sink sheets showing an active region with varied densities and configurations in accordance with one or more embodiments described herein.
Figure 9:
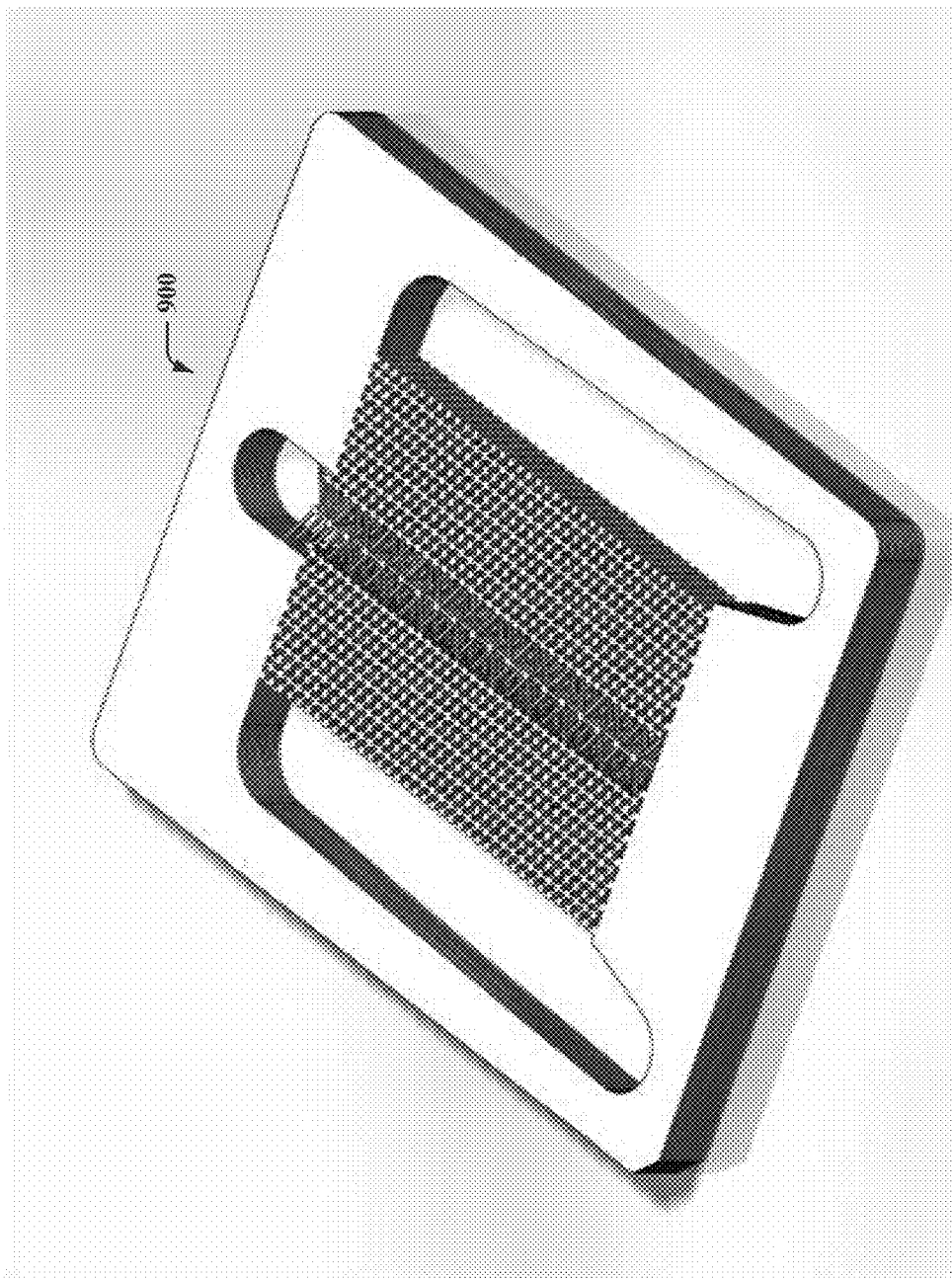
FIG. 9 illustrates a full perspective view showing stacked heat sink sheets to form a cold plate in accordance with one or more embodiments described herein.

FIGS. 8 and 9 illustrate non-limiting perspective views of a stack of heat sink sheets showing active areas with varied densities and configurations in accordance with one or more embodiments described herein. Repetitive description of like elements employed in other embodiments described herein is omitted for sake of brevity. The stack of heat sink sheets to form cold plate 900 can comprise one or more heat sink sheets aligned, wherein the heat sink sheets comprise various configurations to facilitate a desired air or liquid flow across the pin columns and pins 802, 806, 810, 814.

For instance, as shown in FIG. 8, the top heat sink sheet can comprise pins 802 and links 804 traversing the a low performance active area in an ascending fashion from left to right as shown in FIG. 4. Conversely, a heat sink sheet below the top heat sink sheet can comprise a pin 806 and link 808 traversing the a low performance active area in a descending fashion from left to right as shown in FIG. 5. While the terms "top" and "bottom" may be used herein, it should be understand that the structures and/or apparatus referenced can be turned over such that the portion referenced as "top" becomes the "bottom" and vice versa. All such embodiments are envisaged.

Furthermore, when a heat sink sheet is stacked onto another heat sink sheet, the heat sink sheets can be stacked in such a manner that only every $n^{th}$ heat sink sheet comprises an ascending configuration of the pins and links within the low performance active area. The value for n can be any number of integers based on desired system design. In some embodiments, n can be equal to 4.

It should be noted that heat sink sheets comprising varied low performance active area configurations can be stacked in any manner to increase or decrease fluid flow and/or support for a mechanical load while providing appropriate local heat removal capability. The aforementioned configuration of the low performance active area 822 can reduce liquid and/or air flow by half in the active areas and also reduce the distance a liquid can travel by a factor of two, which can reduce a pressure drop and maintain thermal performance for the high performance active areas 818, 820. For example, the liquid can enter from left side of the high performance active area 818 and exit via the low performance active area 822 area, liquid can enter from right side of the high performance active area 820 and exit via the low performance active area 822, and/or liquid can enter from the low performance active area 822 and exit left and right from the high performance active area 818 and high performance active area 820, respectively.

Additionally, the pin portion 810, 814 and link 812, 816 configurations of high performance active areas 818, 820 of the top heat sink sheet can be counter (descending versus ascending) to the pin portion 810, 814 link 812, 816 configurations of the high performance active areas 818, 820 of the heat sink sheet directly below the top heat sink sheet. Consequently, no two links of any adjacently stacked heat sink sheets would touch the other within their respective active areas. However, in an alternative embodiment pin portions 802, 806, 810, 814 and links 804, 808, 812, 816 of adjacently stacked heat sink sheets can follow one pattern (e.g., all descending, all ascending). In yet another alternative embodiment, pin portions 802, 806, 810, 814 and link 804, 808, 812, 816 configurations can alternate based on the heat sink sheet placement. For instance, every fourth heat sink sheet can comprise (ascending) pin portions 802, 806, 810, 814 and links 804, 808, 812, 816 while the second and third heat sink sheets can comprise (descending) pin portions 802, 806, 810, 814 and links 804, 808, 812, 816.

Figure 10:
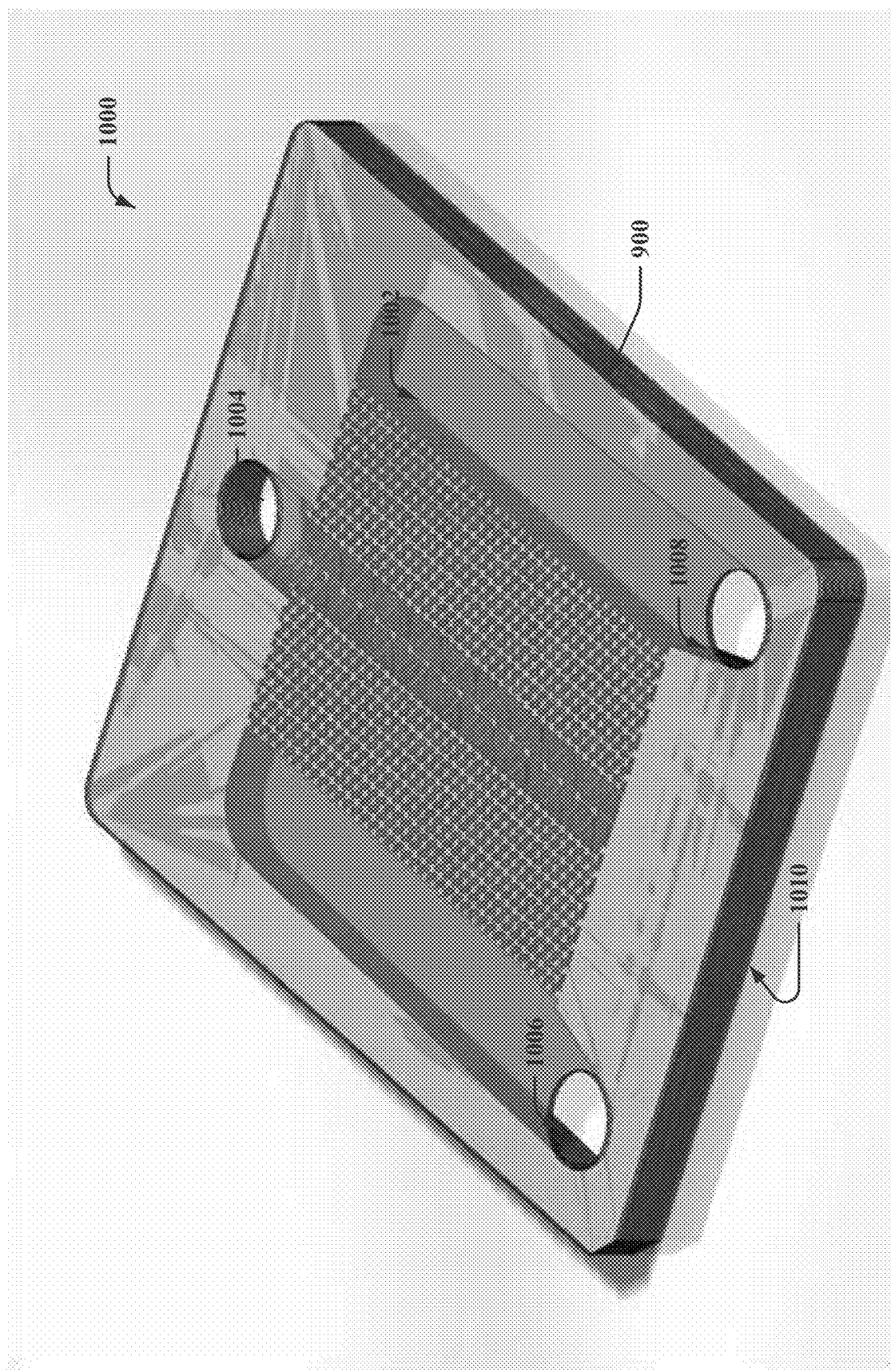
FIG. 10 illustrates a non-limiting perspective view of a stack of heat sink sheets showing an active region with varied densities and configurations comprising an interface plate in accordance with one or more embodiments described herein.

FIG. 10 illustrates a non-limiting perspective view of a stack of heat sink sheets showing an active area with varied densities and configurations comprising an interface plate in accordance with one or more embodiments described herein. Repetitive description of like elements employed in other embodiments described herein is omitted for sake of brevity.

The system 1000 can comprise the cold plate 900 comprising stacked heat sink sheets with various high performance active area and low performance active area configurations and an interface plate 1002. The interface plate 1002 can conform to a load and serve as a constraint to flowing coolant. The interface plate 1002 can be atop the top heat sink sheet of the cold plate 900 and comprise several recesses 1004, 1006, 1008 to facilitate fluid or air transfer. For example, the interface plate 1002 can be fitted within an area providing coolant via the recess 1004 to the cold plate 900. As the coolant flows through the cold plate 900 in a path predicated by the density of the low performance active area in relation to the high performance active areas, the recesses 1006, 1008 can serve as outlets for the fluid to exit the cold plate 900. It should also be noted that in an alternate embodiment, recess 1006 and recess 1008 can be connected to facilitate a different fluid exit path. In a typical configuration a heat sink sheet 1010 opposite the interface plate 1002 (at the bottom of FIG. 10) would be in contact with the device to be cooled.

Figure 11:
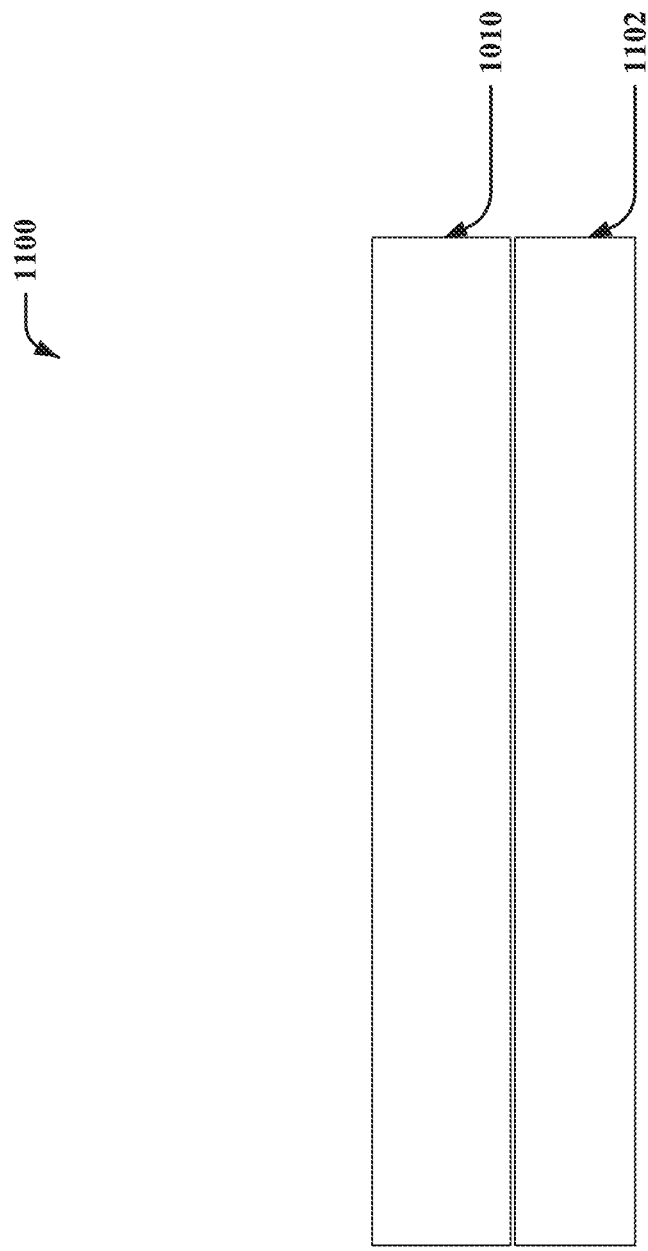
FIG. 11 illustrates a non-limiting side view of a stack comprising a heat sink sheet and a heat source in accordance with one or more embodiments described herein.

FIG. 11 illustrates a non-limiting side view of a stack comprising a heat sink sheet and a heat source in accordance with one or more embodiments described herein. As shown in FIG. 11, a bottom heat sink sheet 1010 can be in contact with the heat source 1102 being cooled.

Figure 12:
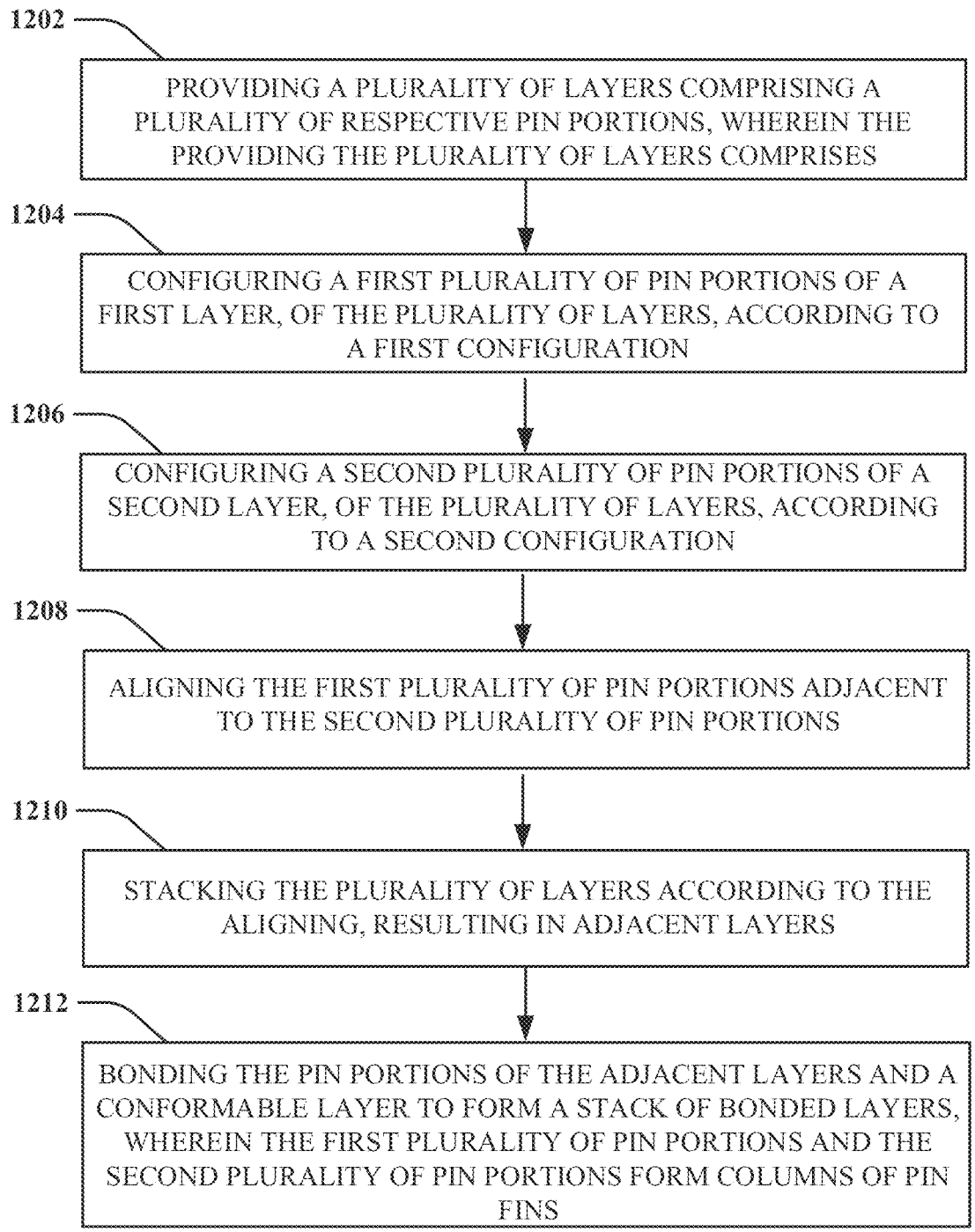
FIG. 12 illustrates a flow diagram of another example, non-limiting method for developing a cold plate apparatus in accordance with one or more embodiments described herein.

FIG. 12 illustrates a flow diagram of another example, non-limiting method for developing a cold plate apparatus. At 1202, the method can comprise providing a plurality of layers comprising a plurality of respective pin portions. The plurality of layers can be comprised of thermally conductive material and can have a defined flexibility that facilitates accommodation of a mechanical load or non-flat heat source. At 1204, providing the plurality of layers can comprise configuring a first plurality of pin portions of a first layer, of the plurality of layers, according to a first configuration. The configurations of the pin portions can change based on the pin-to-link ratio, density and/or orientation (ascending, descending, linear, etc.).

At 1206, providing the plurality of layers can also comprise configuring a second plurality of pin portions of a second layer, of the plurality of layers, according to a second configuration. The plurality of pin portions of the second layer can be configured according to the same configuration as the first layer or a completely different configuration. Additionally, the configuration of the pin portions can be based on a desired fluid or air flow of the cold plate. At 1208, the first plurality of pin portions can be aligned adjacent to the second plurality of pin portions. Aligning the pin portions can ensure that the layers are stacked properly. Therefore, at 1210, the plurality of layers can be stacked according to the aligning, resulting in adjacent layers. Although the layers can be adjacent, their respective pin portion configurations can vary. Furthermore, the pin portions of the adjacent layers can be bonded to form a stack of bonded layers, wherein the first plurality of pin portions and the second plurality of pin portions form columns of pin fins at block 1212.

In addition, the term "or" is intended to mean an inclusive "or" rather than an exclusive "or." That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. Moreover, articles "a" and "an" as used in the subject specification and annexed drawings should generally be construed to mean "one or more" unless specified otherwise or clear from context to be directed to a singular form. As used herein, the terms "example" and/or "exemplary" are utilized to mean serving as an example, instance, or illustration. For the avoidance of doubt, the subject matter disclosed herein is not limited by such examples. In addition, any aspect or design described herein as an "example" and/or "exemplary" is not necessarily to be construed as preferred or advantageous over other aspects or designs, nor is it meant to preclude equivalent exemplary structures and techniques known to those of ordinary skill in the art.

It is, of course, not possible to describe every conceivable combination of methods for purposes of describing this disclosure, but one of ordinary skill in the art can recognize that many further combinations and permutations of this disclosure are possible. Furthermore, to the extent that the terms "includes," "has," "possesses," and the like are used in the detailed description, claims, appendices and drawings such terms are intended to be inclusive in a manner similar to the term "comprising" as "comprising" is interpreted when employed as a transitional word in a claim.

The descriptions of the various embodiments have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A heat sink, comprising:
    a first active region comprising first pin portions having first links connecting some of the first pin portions, and
    a second active region comprising second pin portions having second links connecting some of the second pin portions, wherein the first active region has a first ratio of the first pin portions to the first links that is different than a second ratio of the second pin portions to the second links of the second active region.

2. The heat sink of claim 1, wherein the first pin portions positioned have a first configuration density.

3. The heat sink of claim 2, wherein the second pin portions have a second configuration density.

4. The heat sink of claim 1, further comprising:
    a third active region comprising third pin portions, wherein the third active region is disposed between the first active region and the second active region.

5. The heat sink of claim 1, further comprising:
    a compliant layer positioned to receive a heat source.

6. The heat sink of claim 5, wherein the compliant layer accommodates dimensional differences between the heat source and the heat sink.

7. The apparatus of claim 1, wherein the second active region is configured different from the first active region to facilitate a pressure drop across the heat sink.

8. An apparatus, comprising:
    at least one layer adapted to couple to a heat source, wherein the at least one layer comprises:
        a first active region comprising first pin portions having first links connecting some of the first pin portions,
        a second active region comprising second pin portions having second links connecting some of the second pin portions, wherein the first active region has a first ratio of the first pin portions to the first links that is different than a second ratio of the second pin portions to the second links of the second active region.

9. The apparatus of claim 8, further comprising:
    third links connecting a pair of adjacent pin portions between the first pin portions and the second pin portions to form a planar sheet such that a configuration of a width of the second pin portions to a width of the third links is adapted to make the planar sheet flexible.

10. The apparatus of claim 8, further comprising:
    a third active region comprising third pin portions, wherein the third active region is disposed between the first active region and the second active region.

11. The apparatus of claim 8, further comprising:
    a compliant layer coupled to one or more of the first pin portions and one or more of the second pin portions.

12. The apparatus of claim 11, wherein the compliant layer accommodates dimensional differences between the heat source and the apparatus.

13. The apparatus of claim 8, wherein the second pin portions are configured to facilitate a pressure drop across the apparatus.

14. The apparatus of claim 8, wherein the first pin portions positioned have a first configuration density, and the second pin portions have a second configuration density that is different from the first configuration density.

15. A method comprising:
    bonding a plurality of layers together to form a heat sink, wherein the plurality of layers comprise a first layer comprising:
        a first plurality of pin portions;
        a first active region comprising a first subset of first pin portions of the first plurality of pin portions having first links connecting some of the first pin portions, and
        a second active region comprising a second subset of second pin portions of the first plurality of pin portions having second links connecting some of the second pin portions, wherein the first active region has a first ratio of the first pin portions to the first links that is different than a second ratio of the second pin portions to the second links of the second active region.

16. The method of claim 15, wherein the plurality of layers comprise a second layer comprising a second plurality of pin portions, and the bonding comprises aligning the first plurality of pin portions with the second plurality of pin portions.

17. The method of claim 15, wherein the first active region comprises a first pin density associated with the first pin portions that is less than a second pin density associated with the second pin portions of the second active region.

18. The method of claim 15, wherein the plurality of layers comprise an outer layer, and the bonding comprises positioning the outer layer to receive a heat source.

19. The method of claim 18, wherein the outer layer comprises a thermally conductive material.

20. The method of claim 18, wherein the outer layer accommodates dimensional differences between the heat source and the heat sink.

\* \* \* \* \*